United States Patent
Shi (10) Patent No.: US 10,974,479 B2
(45) Date of Patent: Apr. 13, 2021

(54) BENDING AREA STRUCTURE OF FLEXIBLE DISPLAY PANEL

(71) Applicant: Wuhan China Star Optoelectronics Technology Co., Ltd., Wuhan (CN)

(72) Inventor: Jie Shi, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 42 days.

(21) Appl. No.: 16/477,885

(22) PCT Filed: Jan. 2, 2019

(86) PCT No.: PCT/CN2019/070024
§ 371 (c)(1),
(2) Date: Jul. 14, 2019

(87) PCT Pub. No.: WO2020/042518
PCT Pub. Date: Mar. 5, 2020

(65) Prior Publication Data
US 2020/0147923 A1    May 14, 2020

(30) Foreign Application Priority Data
Aug. 29, 2018    (CN) .......................... 201810995012.0

(51) Int. Cl.
| B32B 3/30 | (2006.01) |
| B32B 27/08 | (2006.01) |
| H01L 51/00 | (2006.01) |
| B32B 7/00 | (2019.01) |
| B29C 59/02 | (2006.01) |
(Continued)

(52) U.S. Cl.
CPC ................. *B32B 3/30* (2013.01); *B32B 7/00* (2013.01); *B32B 27/08* (2013.01);
(Continued)

(58) Field of Classification Search
CPC .. B32B 3/30; B32B 7/00; B32B 27/08; B32B 7/12; B32B 2457/20; B32B 1/00;
(Continued)

(56) References Cited

U.S. PATENT DOCUMENTS

2009/0032997 A1* 2/2009 Hiratsuka .............. B82Y 40/00
                                                              264/293
2019/0237686 A1    8/2019 Jia

FOREIGN PATENT DOCUMENTS

| CN | 103985321 | 8/2014 |
| CN | 103985321 A * | 8/2014 |
(Continued)

OTHER PUBLICATIONS

[NPL-1] Zhai (CN 106328599 A); Jan. 2017 (EPO machine translation). (Year: 2017).*
(Continued)

*Primary Examiner* — David Sample
*Assistant Examiner* — Donald M Flores, Jr.

(57) ABSTRACT

A bending area structure of a flexible display panel is disclosed and includes a flexible substrate layer, a circuit layer, and at least one organic layer. The circuit layer is disposed on the flexible substrate layer. The at least one organic layer is disposed on the circuit layer. A plurality of protrusions are arranged on an upper surface of the at least one organic layer.

16 Claims, 12 Drawing Sheets

(51) Int. Cl.
B29L 31/34 (2006.01)
B32B 7/12 (2006.01)

(52) U.S. Cl.
CPC ........ *H01L 51/0097* (2013.01); *B29C 59/022* (2013.01); *B29L 2031/3475* (2013.01); *B32B 7/12* (2013.01); *B32B 2457/20* (2013.01); *H01L 2251/5338* (2013.01); *Y10T 428/2457* (2015.01); *Y10T 428/24521* (2015.01); *Y10T 428/24529* (2015.01); *Y10T 428/24537* (2015.01); *Y10T 428/24612* (2015.01); *Y10T 428/24669* (2015.01)

(58) Field of Classification Search
CPC ......... H01L 51/0097; H01L 2251/5338; Y10T 428/24521; Y10T 428/24537; Y10T 428/24529; Y10T 428/2457; Y10T 428/24669; Y10T 428/24612; B29C 59/022; B29L 2031/3475; G03F 7/0002; G09F 9/301

See application file for complete search history.

(56) References Cited

FOREIGN PATENT DOCUMENTS

| | | | |
|---|---|---|---|
| CN | 106252380 | | 12/2016 |
| CN | 106252380 | A * | 12/2016 |
| CN | 106328599 | | 1/2017 |
| CN | 106328599 | A * | 1/2017 |
| CN | 107104200 | | 8/2017 |
| CN | 206610569 | | 11/2017 |
| CN | 107527556 | | 12/2017 |
| CN | 108230910 | | 6/2018 |
| CN | 108461630 | | 8/2018 |

OTHER PUBLICATIONS

[NPL-2] Su (CN 106252380 A); Dec. 2016 (EPO machine translation). (Year: 2016).*
[NPL-3] Huo (CN 103985321 A); Aug. 2014 (EPO machine translation). (Year: 2014).*

* cited by examiner

BENDING AREA STRUCTURE OF FLEXIBLE DISPLAY PANEL

RELATED APPLICATIONS

This application is a National Phase of PCT Patent Application No. PCT/CN2019/070024 having International filing date of Jan. 2, 2019, which claims the benefit of priority of Chinese Patent Application No. 201810995012.0 filed on Aug. 29, 2018. The contents of the above applications are all incorporated by reference as if fully set forth herein in their entirety.

FIELD AND BACKGROUND OF THE INVENTION

The present disclosure relates to a bending area structure of a flexible display panel, and more particularly to a bending area structure of a flexible display panel in which a protrusion is disposed on an organic layer to reduce stress received by the bending area.

As the next generation of mainstream display panels, flexible panels have attracted more and more attention. Flexible display panels enable a screen to display a complete picture when the screen is bent freely like a paper. The flexible display panels possess advantages of small size and light weight, which can be used for computers, televisions, personal portable devices, etc.

The flexible display panel is composed of a display area and a non-display area. When preparing a narrow frame or a full screen, a chip of the non-display area must be fixed to a back surface of the display panel. At that time, the bending area is bent 180 degrees. When the bending area is bent 180 degrees, each film layer of the bending area is subjected to a bending stress and stretching thereof for a long time may cause bending cracks to form between the film layers or inside the film layers, thereby reducing a service life of the device.

Therefore, it is necessary to provide an improved bending area structure of a flexible display panel to solve the above technical problems.

Technical Problems

A primary object of the present disclosure is to provide a bending area structure of a flexible display panel to prevent the bending area structure from forming a bending crack.

SUMMARY OF THE INVENTION

In order to achieve the above object, the present disclosure provides a bending area structure of a flexible display panel, comprising: a flexible substrate layer; a circuit layer disposed on the flexible substrate layer; and a first organic layer disposed on the circuit layer, wherein a plurality of first protrusions are arranged on an upper surface of the first organic layer;

a shape of a side projection of the first protrusions is a wave, a shape of a top projection of the first protrusions is an elongated shape, the elongated shape is parallel to a direction of a bending centerline; and the shape of the top projection of the first protrusions is selected from the group consisting of an oval, a square, a trapezoid, and a rhombus.

In an embodiment of the present disclosure, the first protrusions are formed by nanoimprinting.

In an embodiment of the present disclosure, a density of the first protrusions adjacent to the bending centerline is greater than a density of the first protrusions away from the bending centerline.

In an embodiment of the present disclosure, the bending area structure further comprises a second organic layer, the second organic layer is disposed on the first organic layer, a plurality of second protrusions are arranged on an upper surface of the second organic layer, and an elastic modulus of the second organic layer is greater than an elastic modulus of the first organic layer.

In an embodiment of the present disclosure, the bending area structure further comprises a third organic layer, the third organic layer is disposed on the second organic layer, a plurality of third protrusions are arranged on an upper surface of the third organic layer, and an elastic modulus of the third organic layer is greater than an elastic modulus of the second organic layer.

In an embodiment of the present disclosure, the bending area structure further comprises a second organic layer, the second organic layer is disposed on the first organic layer, a plurality of second protrusions are arranged on an upper surface of the second organic layer, and a density of the second protrusions is greater than a density of the first protrusions.

In an embodiment of the present disclosure, the bending area structure further comprises a third organic layer, the third organic layer is disposed on the second organic layer, a plurality of third protrusions are arranged on an upper surface of the third organic layer, and a density of the third protrusions is greater than a density of the second protrusions.

In an embodiment of the present disclosure, the second protrusions and/or the third protrusions are formed by nanoimprinting, a shape of a side projection of the second protrusions and/or the third protrusions is a wave, a shape of a top projection of the second protrusions and/or the third protrusions is an elongated shape, and the elongated shape is parallel to a direction of a bending centerline.

In order to achieve the above object, the present disclosure further provides a bending area structure of a flexible display panel, comprising: a flexible substrate layer; a circuit layer disposed on the flexible substrate layer; and a first organic layer disposed on the circuit layer, wherein a plurality of first protrusions are arranged on the upper surface of the first organic layer.

In an embodiment of the present disclosure, a shape of a top projection of the first protrusions is an elongated shape, and the elongated shape is parallel to a direction of a bending centerline.

In an embodiment of the present disclosure, the shape of the top projection of the first protrusions is selected from the group consisting of an oval, a square, a trapezoid, and a rhombus.

In an embodiment of the present disclosure, the first protrusions are formed by nanoimprinting.

In an embodiment of the present disclosure, a density of the first protrusions adjacent to the bending centerline is greater than a density of the first protrusions away from the bending centerline.

In an embodiment of the present disclosure, the bending area structure further comprises a second organic layer, the second organic layer is disposed on the first organic layer, a plurality of second protrusions are arranged on an upper surface of the second organic layer, and an elastic modulus of the second organic layer is greater than an elastic modulus of the first organic layer.

In an embodiment of the present disclosure, the bending area structure further comprises a third organic layer, the third organic layer is disposed on the second organic layer, a plurality of third protrusions are arranged on an upper surface of the third organic layer, and an elastic modulus of the third organic layer is greater than an elastic modulus of the second organic layer.

In an embodiment of the present disclosure, the bending area structure further comprises a second organic layer, the second organic layer is disposed on the first organic layer, a plurality of second protrusions are arranged on an upper surface of the second organic layer, and a density of the second protrusions is greater than a density of the first protrusions.

In an embodiment of the present disclosure, the bending area structure further comprises a third organic layer, the third organic layer is disposed on the second organic layer, a plurality of third protrusions are arranged on an upper surface of the third organic layer, and a density of the third protrusions is greater than a density of the second protrusions.

In an embodiment of the present disclosure, the bending area structure further comprises a third organic layer, the third organic layer is disposed on the second organic layer, a plurality of third protrusions are arranged on an upper surface of the third organic layer, and a density of the third protrusions is greater than a density of the second protrusions.

In an embodiment of the present disclosure, the second protrusions and/or the third protrusions are formed by nanoimprinting, a shape of a side projection of the second protrusions and/or the third protrusions is a wave, a shape of a top projection of the second protrusions and/or the third protrusions is an elongated shape, and the elongated shape is parallel to a direction of a bending centerline.

Beneficial Effects:

Compared with the existing bending structure of the flexible display panel, the present disclosure can reduce the bending stress by disposing a plurality of protrusions on the organic layer. The protrusions have an effect of reducing the bending stress and preventing the bending area structure from forming a bending crack, thereby increasing a service life of the flexible display panel.

DESCRIPTION OF SPECIFIC EMBODIMENTS OF THE INVENTION

For a better understanding of the aforementioned content of the present invention, preferable embodiments are illustrated in accordance with the attached figures for detailed explanation. Furthermore, directional terminology mentioned in the present disclosure, such as "top", "bottom", "front", "back", "left", "right", "inner", "outer", "lateral", etc., is used with reference to the orientation of the figures being described. Therefore, the directional terminology is used for purposes of illustration and is not intended to limit the present invention.

Figure 1:
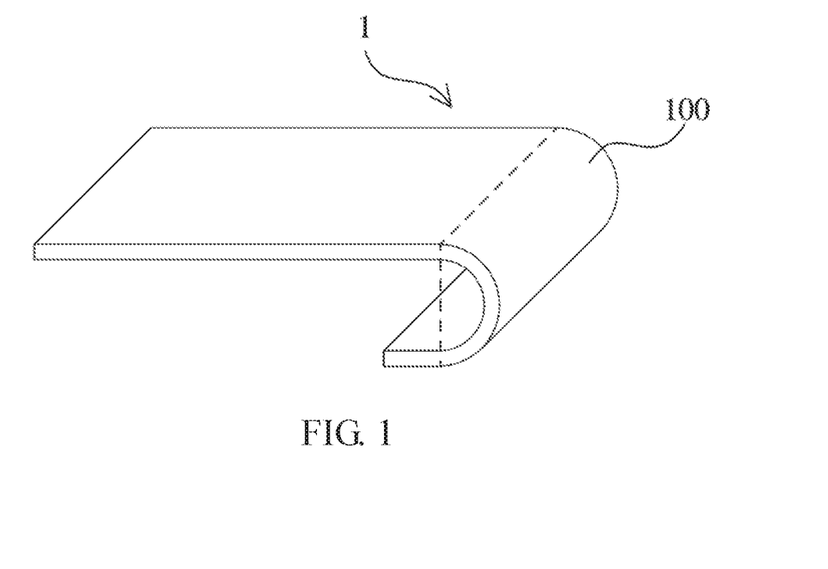
FIG. 1: a schematic diagram showing a flexible display panel of the present disclosure.

Please refer to FIG. 1 which is a schematic diagram showing a flexible display panel of the present disclosure. The flexible display panel 1 of the present disclosure has a bending area structure 100 that can be bent up to a maximum of 180 degrees.

Figure 2A:
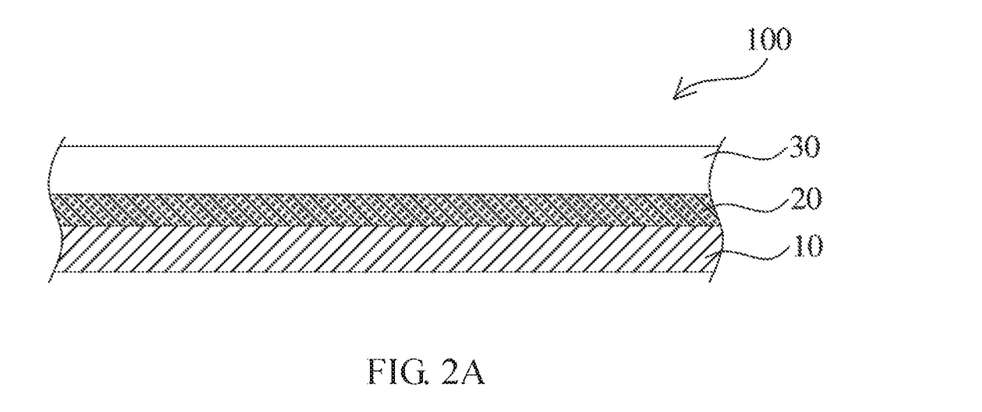
FIGS. 2A, 2B and 2C: schematic views showing a manufacturing method of a bending area structure of a flexible display panel of a first embodiment of the present disclosure.
Figure 2B:
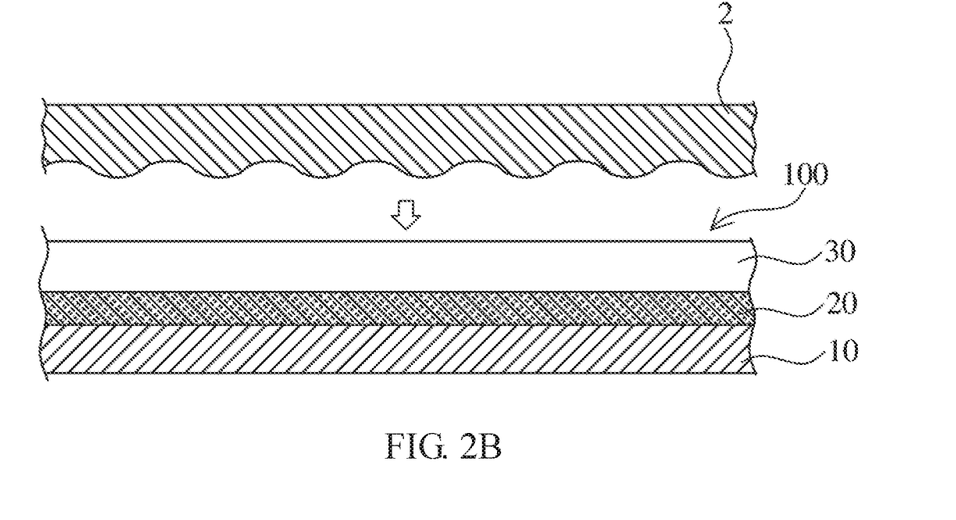
Figure 2C:
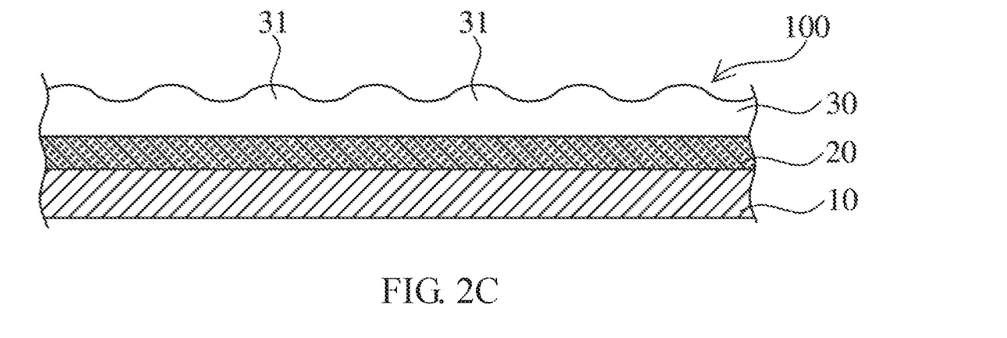
Figure 3:
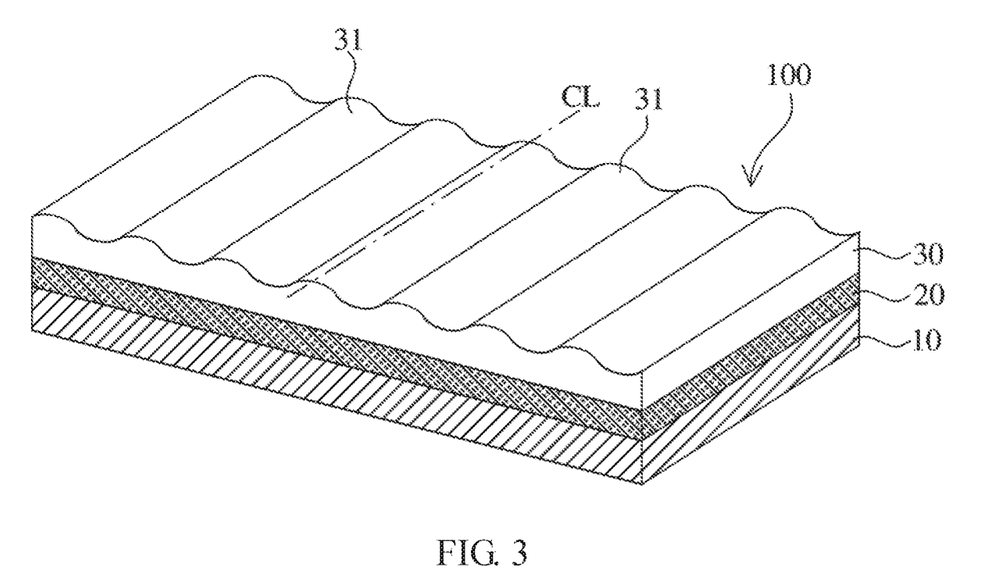
FIG. 3: a perspective schematic view showing the bending area structure of the flexible display panel of the first embodiment of the present disclosure.

Please refer to FIG. 2A-2C and FIG. 3. FIG. 2A-2C are schematic views showing a manufacturing method of a bending area structure of a flexible display panel of a first embodiment of the present disclosure, and FIG. 3 is a perspective schematic view showing the bending area structure of the flexible display panel of the first embodiment of the present disclosure. The manufacturing method of the bending area structure 100 of the flexible display panel of the first embodiment of the present disclosure comprises the following steps:

First, as shown in FIG. 2A, providing a bending area structure 100 of a flexible display panel. The bending area structure 100 includes a flexible substrate layer 10, a circuit layer 20, and a first organic layer 30. The circuit layer 20 is disposed on the flexible substrate layer 10. The first organic layer 30 is disposed on the circuit layer 20.

Next, as shown in FIG. 2B, providing a nanoimprinting head 2. A lower surface of the nanoimprinting head 2 has a predetermined shape, and the nanoimprinting head 2 is pressed down to an upper surface of the first organic layer 30.

Finally, as shown in FIG. 2C, forming a shape corresponding to the predetermined shape on the upper surface of the first organic layer 30, i.e., a plurality of first protrusions 31 are formed and arranged on the upper surface of the first organic layer 30.

In the present embodiment, the first organic layer 30 is formed on the circuit layer 20 by a process, such as spin coating or ink jet printing (IJP). A thickness of the first organic layer can be 0.5 to 5 micrometers (um). Material of the organic layer such as, but not limited to, a resin, such as acrylic resin (acryl), epoxy resin (epoxy), or polycarbonate (PC).

In the present embodiment, the first protrusions 31 are preferably in an elongated shape. In detail, a shape of a side projection of the first protrusions 31 is a wave and a shape of a top projection of the first protrusions 31 is an elongated shape. The elongated shape is parallel to a direction of a bending centerline CL, as shown in FIG. 3.

In the present embodiment, when the bending area structure 100 of the flexible display panel is bent, especially when the bending area is bent 180 degrees, the bending area structure 100 is subjected to a bending stress. An effect of reducing the bending stress is produced by disposing of a plurality of protrusions 31 on the organic layer. Therefore, the bending area structure 100 is prevented from forming a bending crack between the film layers or inside the film layers, thereby increasing a service life of the flexible display panel 1.

Figure 4:
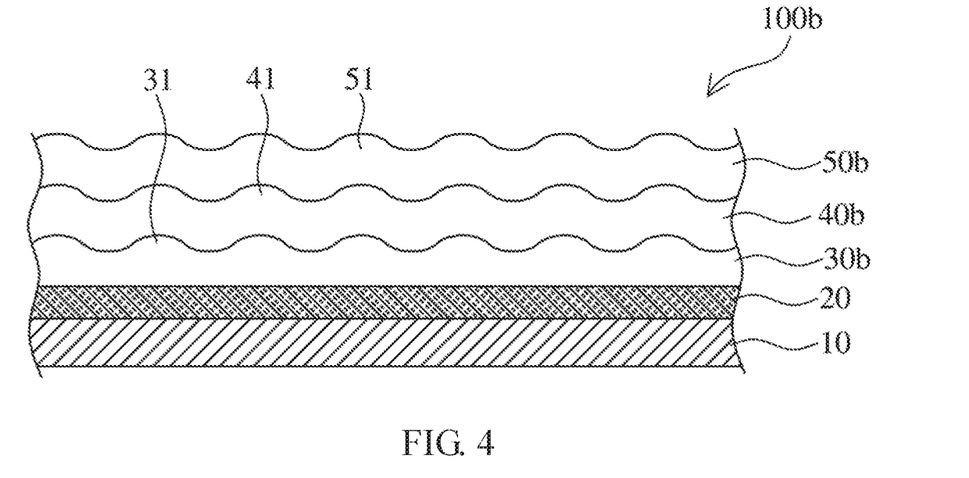
FIG. 4: a side cross-sectional view showing a bending area structure of a flexible display panel of a second embodiment of the present disclosure.

Please refer to FIG. 4 which is a side cross-sectional view showing a bending area structure a flexible display panel of a second embodiment of the present disclosure. The bending area structure of the second embodiment of the present disclosure is substantially the same as the bending area structure of the first embodiment of the present disclosure, and thus the same reference numerals are used. However, main differences between the bending area structure 100b of the second embodiment of the present disclosure and the bending area of the first embodiment the structure 100 are that the bending area structure 100b of the second embodiment of the present disclosure further includes a second organic layer 40b and a third organic layer 50b. The second organic layer 40b is disposed in the first organic layer 30b. A plurality of second protrusions 41 are arranged on an upper surface of the second organic layer 40b. The third organic layer 50b is disposed on the second organic layer 40b and a plurality of third protrusions 51 are arranged on an upper surface of the third organic layer 50b.

In the present embodiment, the second protrusions 41 and/or the third protrusions 51 may also be formed by nanoimprinting, a shape of the side projection of the second protrusions 41 and/or the third protrusions 51 is a wave. A shape of a top projection of the second protrusions 41 and/or the third protrusions 51 is an elongated shape. The elongated shape is parallel to a direction of a bending centerline CL.

In the present embodiment, because the number of the organic layers is increased and each organic layer has a plurality of protrusions, the effect of reducing the bending stress can be further increased.

In the present embodiment, a total thickness of the organic layer may be less than 5 micrometers (um) and the number of the organic layer is not limited to three layers.

Preferably, because the closer to an upper side of the bending area structure 100b, the greater the bending stress, an elastic modulus of the organic layer that is closer to an upper side is greater, i.e., an elastic modulus of the second organic layer 40b is greater than an elastic modulus of elasticity of the first organic layer 30b. An elastic modulus of the third organic layer 50b is greater than an elastic modulus of the second organic layer 40b and the effect of reducing bending stress can be further increased.

Figure 5:
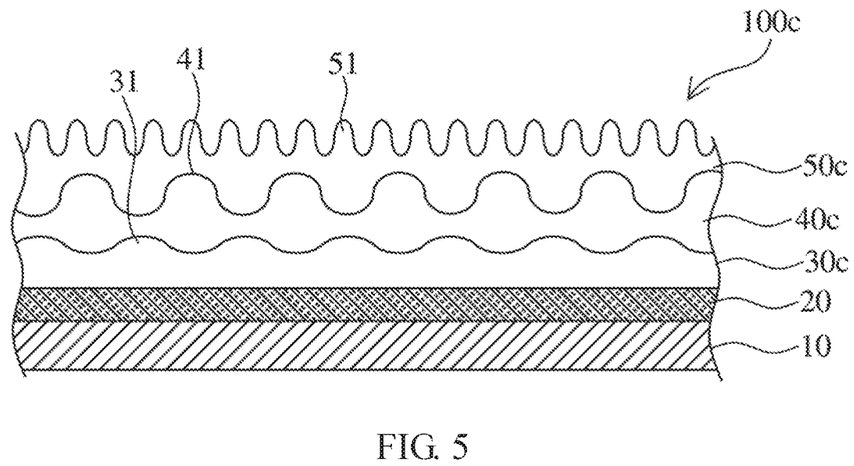
FIG. 5: a side cross-sectional view showing a bending area structure of a flexible display panel of a third embodiment of the present disclosure.

Please refer to FIG. 5 which is a side cross-sectional view showing a bending area structure of a flexible display panel of a third embodiment of the present disclosure. The bending area structure of the third embodiment of the present disclosure is substantially the same as the bending area structure of the second embodiment of the present disclosure, and thus the same reference numerals are used. Therefore, main differences between the bending area structure 100c of the third embodiment of the present disclosure and the bending area structure 100b of the second embodiment are that a density of the second protrusions 41 is greater than a density of the first protrusions 31 and a density of the third protrusions 51 is greater than the density of the second protrusion 41.

In the present embodiment, because the closer to an upper side of the bending area structure 100b, the greater the bending stress, a density of the protrusion of the organic layer that is closer to the upper side is greater and the effect of reducing bending stress can be further increased.

Figure 6:
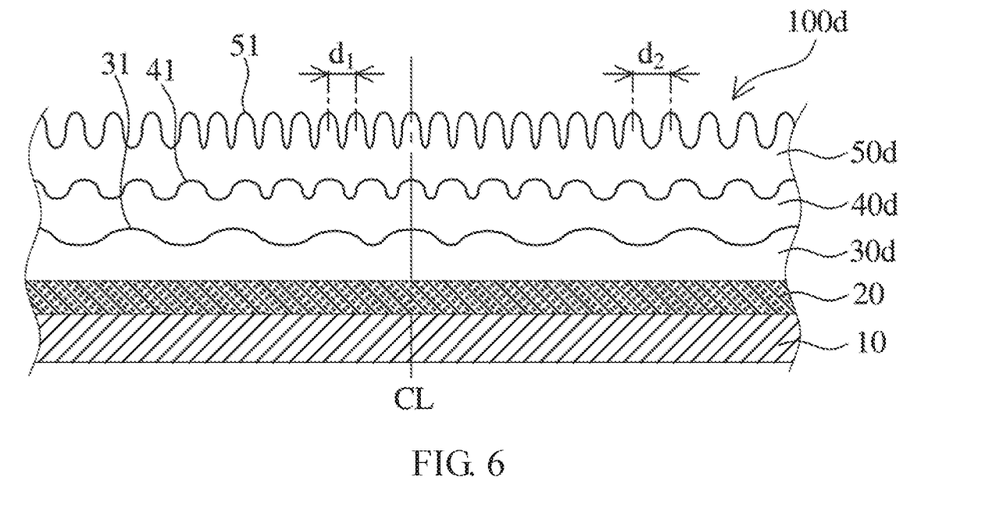
FIG. 6: a side cross-sectional view showing a bending area structure of a flexible display panel of a fourth embodiment of the present disclosure.

Please refer to FIG. 6 which is a side cross-sectional view showing a bending area structure of a flexible display panel of a fourth embodiment of the present disclosure. The bending area structure of the fourth embodiment of the present disclosure is substantially the same as the bending area structure of the third embodiment of the present disclosure, and thus the same reference numerals are used. However, main differences between the bending area structure 100d of the fourth embodiment of the present disclosure and the bending area structure 100c of the third embodiment are that in each of the organic layers of the embodiment, the closer to the bending centerline CL, the greater the density of the protrusions than the density of the first protrusions that is away from the bending centerline CL.

As shown in FIG. 6, the third organic layer 50d serves as an example to exemplify that a distance d1 between the two third protrusions 51 which are close to the bending centerline CL is smaller than a distance between the two first protrusions 51 which are away from the bending centerline, i.e., a density of the two first protrusions which is close to the bending centerline CL is greater than a density of the first protrusions away from the bending centerline density.

In the present embodiment, because the closer to a center of the bending area structure 100b, the greater the bending stress. Therefore, a density of the protrusion of the organic layer that is closer to the center is greater and the effect of reducing bending stress can be further increased.

Please refer to FIG. 7A-7D which are schematic top views showing a first organic layer of a bending area structure of a flexible display panel of fifth to eighth embodiments of the present disclosure. The bending area structure of the fifth to eighth embodiments of the present disclosure is substantially the same as the bending area structure of the first embodiment of the present disclosure, and thus the same reference numerals are used. However, main differences between the bending area structure of the fifth to eighth embodiments of the present disclosure and the bending area structure of the first embodiment are that a shape of a top projection of the first protrusions 31a is an oval, a square, a trapezoid, and a rhombus. The square-shaped first protrusions 31a are exemplified here below.

Figure 7A:
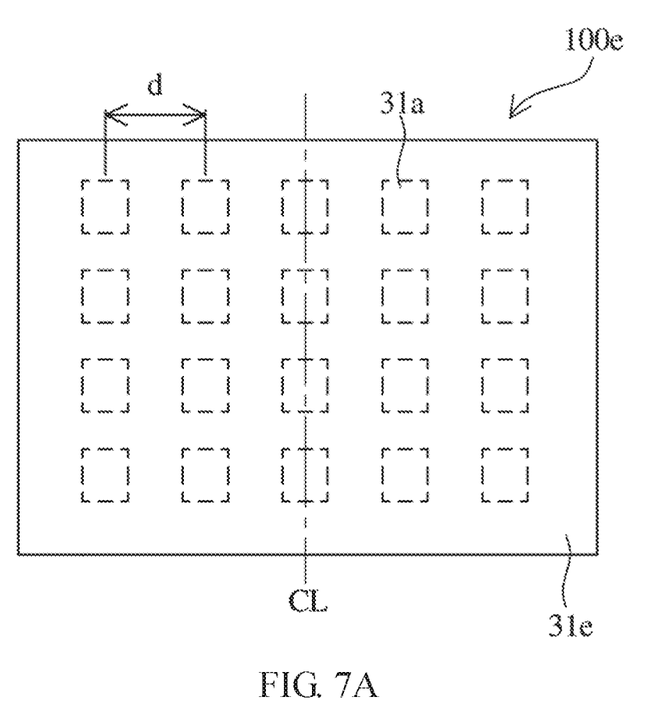
FIGS. 7A, 7B, 7C and 7D: schematic top views showing a first organic layer of a bending area structure of a flexible display panel of fifth to eighth embodiments of the present disclosure.

As shown in FIG. 7A, in the fifth embodiment of the present disclosure, the first protrusions 31a are arranged in an array on the first organic layer 30e, and distances d between the first protrusions 31a are uniform, i.e., densities are uniform. The bending stress received by the bending area structure 100e is reduced by the first protrusions 31a which are arranged in an array.

Figure 7B:
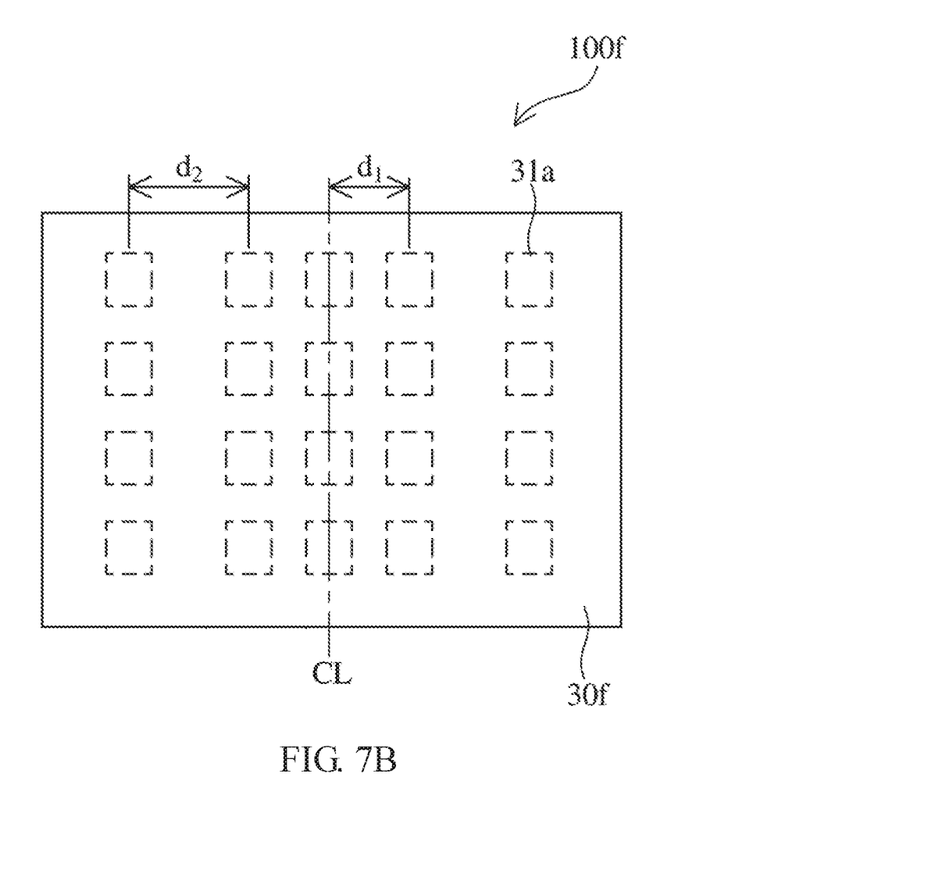

As shown in FIG. 7B, in the sixth embodiment of the present disclosure, the first protrusions 31a are arranged in an array on the first organic layer 30f. A distance d1 between the two first protrusions 31a which is close to the bending centerline CL is smaller than a distance between the two first protrusions 31a which is far from the bending centerline CL, i.e., a density of the protrusions 31a which is close to the bending centerline CL is greater than a density of the projections 31a which is away from the bending centerline. Therefore, the bending stress of the bending area structure 100f can be further reduced.

Figure 7C:
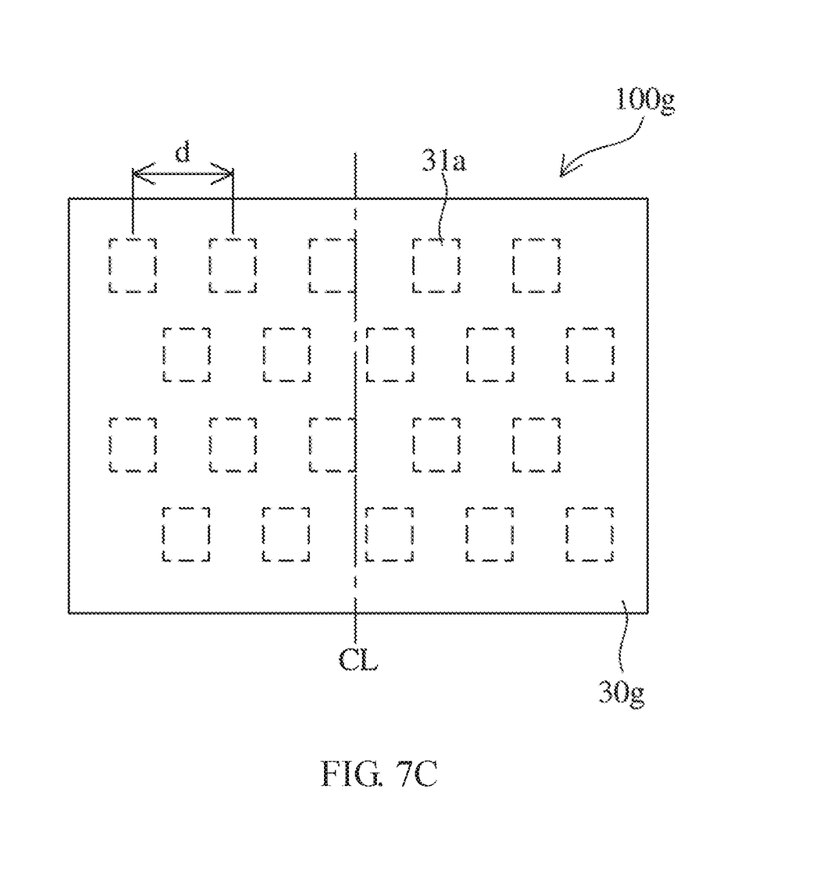

As shown in FIG. 7C, the seventh embodiment of the present disclosure is substantially the same as the fifth embodiment. The first protrusions 31a are arranged in an array on a first organic layer 30g. Distances d between the first protrusions 31a are uniform, i.e., the density is uniform. However, the first protrusions 31a of adjacent rows are alternately disposed, so that the effect of dispersing the bending stress of the bending area structure 100g is further increased.

Figure 7D:
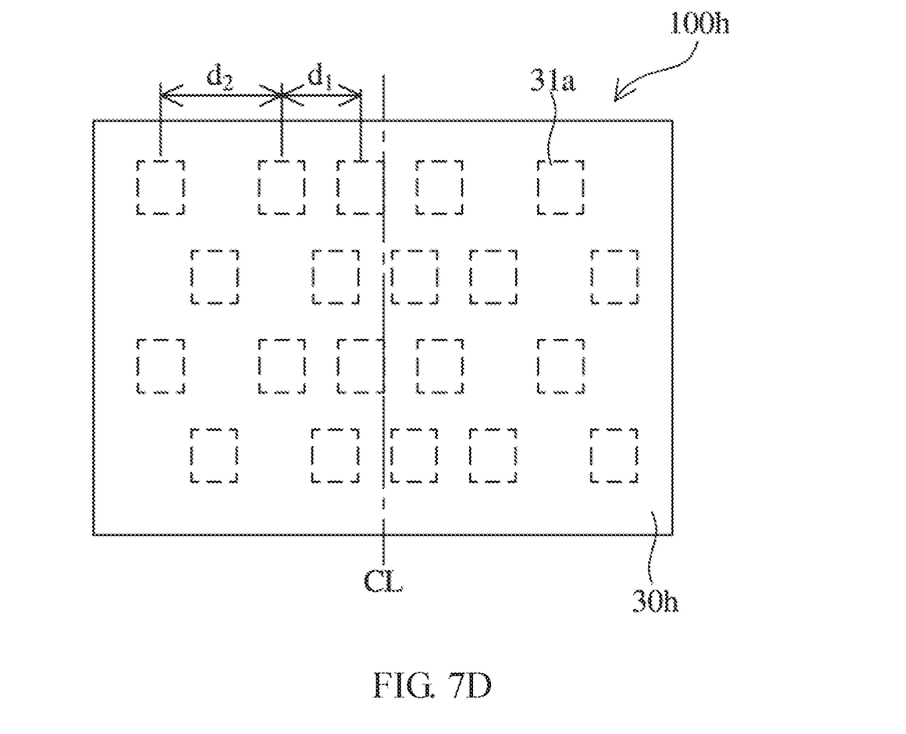

As shown in FIG. 7D, the eighth embodiment of the present disclosure is substantially the same as the sixth embodiment. The two first protrusions 31a are arranged in an array on a first organic layer 30h. A distance d1 between the two first protrusions 31a which is close to the bending centerline CL is smaller than a distance between the two first protrusions 31a which is far from the bending centerline, i.e., a density of the protrusion 31a which is close to the bending centerline CL is greater than a density of the protrusions 31a which is away from the bending centerline. However, positions of the first protrusions 31a of adjacent rows are alternately disposed, so that an effect of dispersing the bending stress of the bending area structure 100g is further increased.

In summary, in the present disclosure, when the bending area structure 100 of the flexible display panel is bent, especially when the bending area is bent 180 degrees, the bending area structure 100 is subjected to a bending stress. An effect of reducing the bending stress is produced by disposing of a plurality of protrusions on the organic layer. Therefore, the bending area structure 100 is prevented from forming a bending crack between the film layers or inside the film layers, thereby increasing a service life of the flexible display panel 1. Furthermore, because the closer to an upper side or a center of the bending area structure 100b, the greater the bending stress, by increasing an elastic modulus of the organic layer that is closer to an upper side of the bending area structure, or by increasing density of the protrusion which are close to the upper side of the bending area structure 100 or are close to the bending centerline CL, the effect of reducing the bending stress is greater.

The present disclosure has been described by the above corresponding embodiments, but the above embodiments are merely examples for implementing the present disclosure. It is noted that the disclosed embodiments do not limit the scope of the invention. In contrast, any modifications and equivalent substitutions made within spirit and principles of the present disclosure are considered encompassed in the scope of protection defined by the claims of the present disclosure.

What is claimed is:

1. A bending area structure of a flexible display panel, comprising:
   a flexible substrate layer;
   a circuit layer disposed on the flexible substrate layer; and
   a first organic layer disposed on the circuit layer, wherein a plurality of first protrusions are arranged on an upper surface of the first organic layer; a shape of a side projection of the first protrusions is a wave, a shape of a top projection of the first protrusions is an elongated shape, the elongated shape is parallel to a direction of a bending centerline; the shape of the top projection of the first protrusions is selected from the group consisting of an oval, a square, a trapezoid, and a rhombus; and the bending area structure further comprises a second organic layer, the second organic layer is disposed on the first organic layer, a plurality of second protrusions are arranged on an upper surface of the second organic layer, and an elastic modulus of the second organic layer is greater than an elastic modulus of the first organic layer.

2. The bending area structure of the flexible display panel of claim 1, wherein the first protrusions are formed by nanoimprinting.

3. The bending area structure of the flexible display panel of claim 1, wherein a density of the first protrusions adjacent to the bending centerline is greater than a density of the first protrusions away from the bending centerline.

4. The bending area structure of the flexible display panel of claim 1, wherein the bending area structure further comprises a third organic layer, the third organic layer is disposed on the second organic layer, a plurality of third protrusions are arranged on an upper surface of the third organic layer, and an elastic modulus of the third organic layer is greater than the elastic modulus of the second organic layer.

5. The bending area structure of the flexible display panel of claim 1, wherein a density of the second protrusions is greater than a density of the first protrusions.

6. The bending area structure of the flexible display panel of claim 1, wherein the bending area structure further comprises a third organic layer, the third organic layer is disposed on the second organic layer, a plurality of third protrusions are arranged on an upper surface of the third organic layer, and a density of the third protrusions is greater than the density of the second protrusions.

7. The bending area structure of the flexible display panel of claim 6, wherein the second protrusions and/or the third protrusions are formed by nanoimprinting, a shape of a side projection of the second protrusions and/or the third protrusions is a wave, a shape of a top projection of the second protrusions and/or the third protrusions is an elongated shape, and the elongated shape is parallel to the direction of the bending centerline.

8. A bending area structure of a flexible display panel, comprising: a flexible substrate layer; a circuit layer disposed on the flexible substrate layer; and a first organic layer disposed on the circuit layer, wherein a plurality of first protrusions are arranged on the upper surface of the first organic layer; wherein a shape of a top projection of the first protrusions is an elongated shape, and the elongated shape is parallel to a direction of a bending centerline; the bending area structure further comprises a second organic layer, the second organic layer is disposed on the first organic layer, a plurality of second protrusions are arranged on an upper surface of the second organic layer, and a density of the second protrusions is greater than a density of the first protrusions.

9. The bending area structure of the flexible display panel of claim 8, wherein a shape of a top projection of the first protrusions is selected from the group consisting of an oval, a square, a trapezoid, and a rhombus.

10. The bending area structure of the flexible display panel of claim 9, wherein a density of the first protrusions adjacent to the bending centerline is greater than a density of the first protrusions away from the bending centerline.

11. The bending area structure of the flexible display panel of claim 8, wherein the first protrusions are formed by nanoimprinting.

12. The bending area structure of the flexible display panel of claim 8, wherein a density of the first protrusions adjacent to the bending centerline is greater than a density of the first protrusions away from the bending centerline.

13. The bending area structure of the flexible display panel of claim 8, wherein an elastic modulus of the second organic layer is greater than an elastic modulus of the first organic layer.

14. The bending area structure of the flexible display panel of claim 13, wherein the bending area structure further comprises a third organic layer, the third organic layer is disposed on the second organic layer, a plurality of third protrusions are arranged on an upper surface of the third organic layer, and an elastic modulus of the third organic layer is greater than the elastic modulus of the second organic layer.

15. The bending area structure of the flexible display panel of claim 8, wherein the bending area structure further comprises a third organic layer, the third organic layer is disposed on the second organic layer, a plurality of third protrusions are arranged on an upper surface of the third organic layer, and a density of the third protrusions is greater than the density of the second protrusions.

16. The bending area structure of the flexible display panel of claim 15, wherein the second protrusions and/or the third protrusions are formed by nanoimprinting, a shape of a side projection of the second protrusions and/or the third protrusions is a wave, a shape of a top projection of the second protrusions and/or the third protrusions is an elongated shape, and the elongated shape is parallel to the direction of the bending centerline.

* * * * *